US009072209B2

(12) United States Patent
Schuster

(10) Patent No.: US 9,072,209 B2
(45) Date of Patent: *Jun. 30, 2015

(54) METHOD FOR FORMING A CONDUCTIVE PATTERN

(71) Applicant: Eastman Kodak Company, Rochester, NY (US)

(72) Inventor: Israel Schuster, Kiriyat Tivon (IL)

(73) Assignee: EASTMAN KODAK COMPANY, Rochester, NY (US)

( * ) Notice: Subject to any disclaimer, the term of this patent is extended or adjusted under 35 U.S.C. 154(b) by 69 days.

This patent is subject to a terminal disclaimer.

(21) Appl. No.: 13/917,946

(22) Filed: Jun. 14, 2013

(65) Prior Publication Data

US 2014/0370185 A1    Dec. 18, 2014

(51) Int. Cl.

| | |
|---|---|
| *C23C 18/54* | (2006.01) |
| *H05K 3/46* | (2006.01) |
| *C23C 18/18* | (2006.01) |
| *C23C 18/16* | (2006.01) |
| *C23C 18/20* | (2006.01) |
| *C23C 18/30* | (2006.01) |
| *C23C 18/32* | (2006.01) |
| *C23C 18/38* | (2006.01) |
| *C23C 18/42* | (2006.01) |

(52) U.S. Cl.
CPC ............. *H05K 3/4688* (2013.01); *C23C 18/54* (2013.01); *C23C 18/1879* (2013.01); *C23C 18/1608* (2013.01); *C23C 18/1612* (2013.01); *C23C 18/1803* (2013.01); *C23C 18/1831* (2013.01); *C23C 18/1851* (2013.01); *C23C 18/2006* (2013.01); *C23C 18/2066* (2013.01); *C23C 18/30* (2013.01); *C23C 18/32* (2013.01); *C23C 18/38* (2013.01); *C23C 18/42* (2013.01)

(58) Field of Classification Search
CPC ................................. C23C 18/16; C23C 18/40
USPC .......... 427/554, 555, 856, 597, 508, 553, 596, 427/145, 58, 306, 504, 304, 97.9, 99.5, 437, 427/443.1; 428/901
See application file for complete search history.

(56) References Cited

U.S. PATENT DOCUMENTS

| | | | | |
|---|---|---|---|---|
| 3,011,920 | A * | 12/1961 | Shipley, Jr. | 106/1.11 |
| 4,004,051 | A * | 1/1977 | Kadison et al. | 427/304 |
| 4,822,633 | A * | 4/1989 | Inoue | 427/552 |
| 5,153,023 | A * | 10/1992 | Orlowski et al. | 427/555 |
| 8,795,788 | B2 * | 8/2014 | Schuster | 427/504 |
| 2009/0252938 | A1 * | 10/2009 | Baik et al. | 428/209 |
| 2014/0134326 | A1 | 5/2014 | Schuster | |

OTHER PUBLICATIONS

Lu et al.; Palladium-free catalytic electroless copper deposition on bamboo fabric: Preparation, morphology, and electromagnetic properties; Applied Surface Science, vol. 258, Issue 10, Mar. 1, 2012.

* cited by examiner

*Primary Examiner* — Michael Cleveland
*Assistant Examiner* — Tabassom Tadayyon Eslami
(74) *Attorney, Agent, or Firm* — Nelson Adrian Blish

(57) ABSTRACT

A method for forming a conductive pattern on a substrate (208) includes providing an image pattern for imaging on the substrate; imaging the image pattern on the substrate creating imaged areas; spraying functional material (240) on the substrate that diffuse molecules of the functional material into the imaged areas and wherein the functional material is in a form of liquid; and applying electro-less copper coating that builds conductive material traces on the imaged areas on the substrate.

5 Claims, 5 Drawing Sheets

ELECTROLESS PLATING PROCESS LINE

METHOD FOR FORMING A CONDUCTIVE PATTERN

CROSS REFERENCE TO RELATED APPLICATIONS

Reference is made to commonly-assigned U.S. patent application Ser. No. 13/676,441 (now U.S. Publication No. 2014/0130737), filed Nov. 14, 2012, entitled FUNCTIONAL PRINTING SYSTEM, by Schuster; U.S. patent application Ser. No. 13/676,464 (now U.S. Pat. No. 8,795,788), filed Nov. 14, 2012, entitled METHOD FOR FUNCTIONAL PRINTING SYSTEM, by Schuster; and U.S. patent application Ser. No. 13/917,924, filed Jun. 14, 2013, entitled SYSTEM FOR FORMING A CONDUCTIVE PATTERN, by Schuster; the disclosures of which are incorporated herein.

FIELD OF THE INVENTION

The present invention relates to an apparatus for functional printing using computer-to-plate imaging technology.

BACKGROUND OF THE INVENTION

Functional printing is a category of printing that uses commercial printing equipment to print circuits or electronic devices which have a function other than, or in addition to, visual display of information. An example of printed circuits is printing radio frequency identification (RFID) on a package or a product. Another example may be printing an electronic circuit on a package which is capable of producing music when the package is opened.

There are several approaches for printing functional patterns on substrates including direct printing of functional inks Other techniques use photolithography to mask and remove a pre-deposited functional layer. There is a need however for accurate deposition for functional material.

SUMMARY OF THE INVENTION

Briefly, according to one aspect of the present invention a method for forming a conductive pattern on a substrate includes providing an image pattern for imaging on the substrate; imaging the image pattern on the substrate creating imaged areas; spraying functional material on the substrate that diffuse molecules of the functional material into the imaged areas and wherein the functional material is in a form of liquid; and applying electro-less copper coating that builds conductive material traces on the imaged areas on the substrate.

One embodiment of the invention uses thermal writing devices, e.g. laser writing heads, or thermal transfer writing heads, to form a thermal pattern on the substrate which, combined with the chemical environment, forms a pattern of functional chemical traces on the substrate. This pattern can be used as is for various applications such as forming hydrophilic/hydrophobic regions for printing processes. Another use is to form a pattern of a catalyst material that can be used for electro-less deposition of metal such as copper, thereby forming copper traces on the substrate.

The use of laser imaging or thermal transfer to a substrate with a combination of sprayed material such as gas applied on the imaged areas is one technology for accurate deposition. The gas molecules are diffused towards the laser heated substrate to create a chemical compound between the gas and the material deposited on the surface of the substrate. The gas is referred to as functional gas and creates a compound of traces on the substrate that is used to form conductive lines for example.

The invention and its objects and advantages will become more apparent in the detailed description of the preferred embodiment presented below.

DETAILED DESCRIPTION OF THE INVENTION

The present invention will be directed in particular to elements forming part of, or in cooperation more directly with the apparatus in accordance with the present invention. It is to be understood that elements not specifically shown or described may take various forms well known to those skilled in the art.

While the present invention is described in connection with one of the embodiments, it will be understood that it is not intended to limit the invention to this embodiment. On the contrary, it is intended to cover alternatives, modifications, and equivalents as covered by the appended claims.

Figure 1:
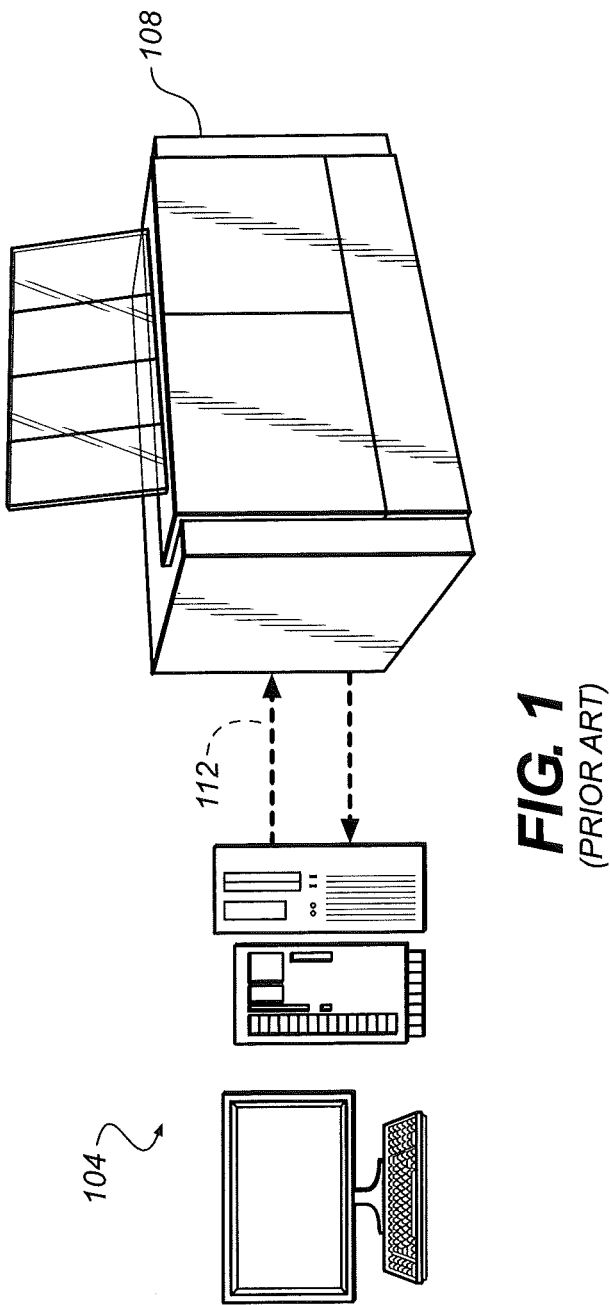
FIG. 1 represents in diagrammatic form a prior art digital front end for driving an imaging device.

FIG. 1 shows a plate imaging device 108. The imaging device is driven by a digital front end (DFE) 104. The DFE receives imaging data in a digital form from desktop publishing (DTP) systems (not shown), and renders the digital information for imaging. The rendered information and imaging device control data are communicated between DFE 104 and imaging device 108 over interface line 112.

Figure 2A:
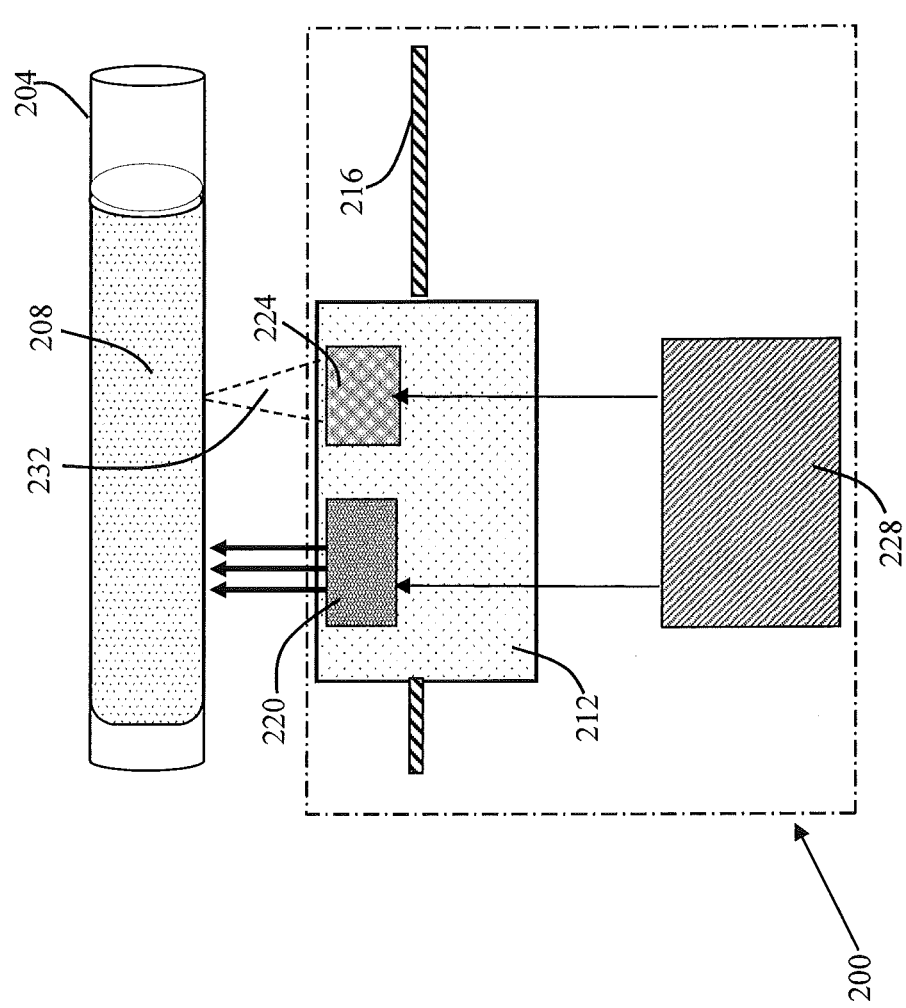
FIG. 2A represents in diagrammatic form the imaging system of FIG. 1.

FIG. 2A shows an imaging system 200. The imaging system 200 includes an imaging carriage 212 on which a material spray element 224 is mounted along with a thermal imaging head 220. The sprayed material can be in a form of gas, liquid or fine powder. The thermal imaging head 220 can be based on thermal transfer means or laser imaging components. The thermal imaging head 220 is designed to operate of a wavelength matching the substrate 208 characteristics. The thermal imaging head 220 is configured to image on substrate 208 mounted on a rotating cylinder 204. The carriage 212 is adapted to move substantially in parallel to cylinder 204 guided by screw 216. Controller 228 controls patterning process of thermal imaging head 220 and material emission from material spray element 224. A computer-to-plate (CTP) device capable to image on flat surfaces, known as capstan devices, can be used as well for the same purpose (not shown). An internal drum CTP (not shown) configuration can be used in conjunction with this invention as well.

Imaging substrate 208, comprised of glass, metal or various polymeric materials, is mounted on rotating cylinder 204. Depending on the specific process, a material spray element 224 deploys a material in proximity of imaging substrate 208. The material may be applied prior, during or after laser exposure. Thermal imaging head 220 will image a pattern according to data received from DFE 104 on imaging substrate 208. The CTP imaging head 220 will elevate the temperature of imaging substrate 208, or opto-chemically modify its surface in the imaged areas to enable an efficient diffusion/bonding process of the functional sprayed material 232 molecules into substrate 208. Thus, the pattern created by thermal imaging head 220 induces a doping pattern on imaging substrate 208. For example, near IR (NIR) imaging head can be used for imaging on a specialized NIR absorbing polyethylene terephthalate (PET) substrate, while applying catalyst material in a form of gas or liquid, such as 3-mercaptopropyltrimethoxysilane (MPTS) or palladium fine powder, to create traces of catalyst doping on imaging substrate 208. The liquid material may be Palladium Chloride (PdCl2) solution.

Figure 2B:
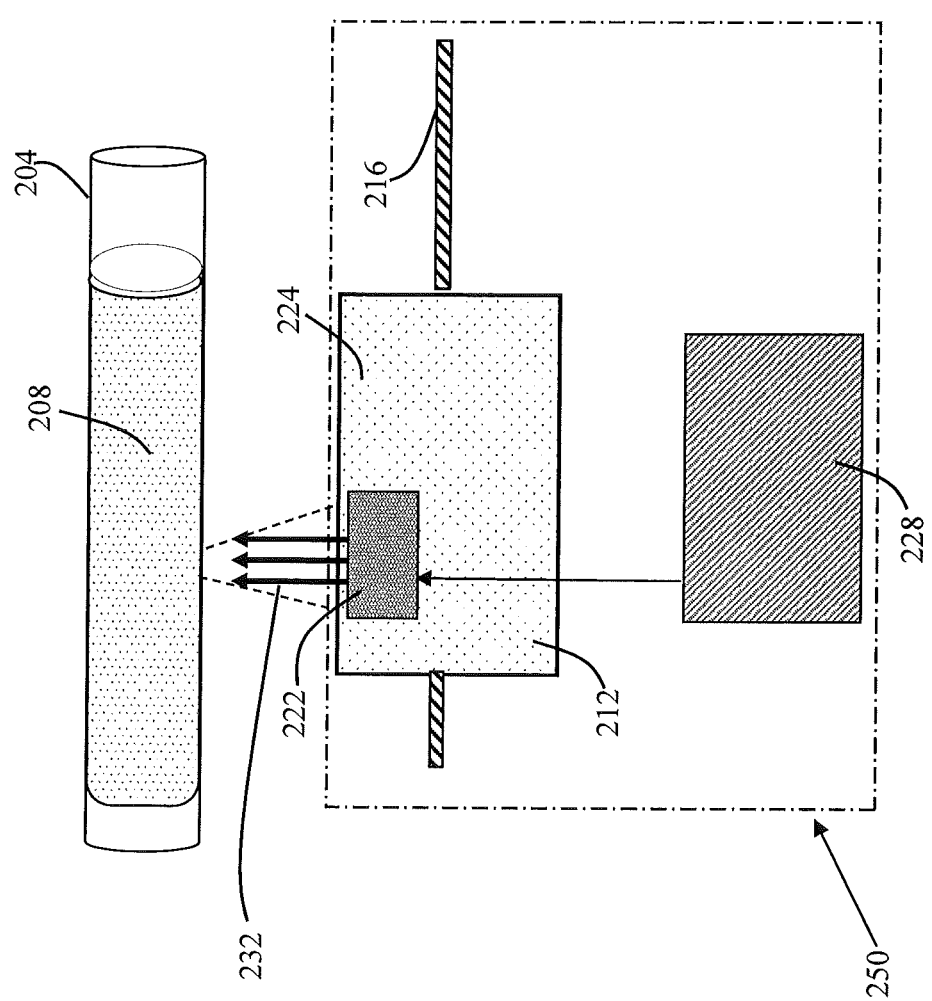
FIG. 2B represents in diagrammatic form an embodiment of the imaging system having the thermal imaging element embedded functional material spraying element.

FIG. 2B shows another imaging system 250, similar to imaging system 200. The main difference between the systems is that system 250 contains an integrated imaging and spaying element 222.

Figure 2C:
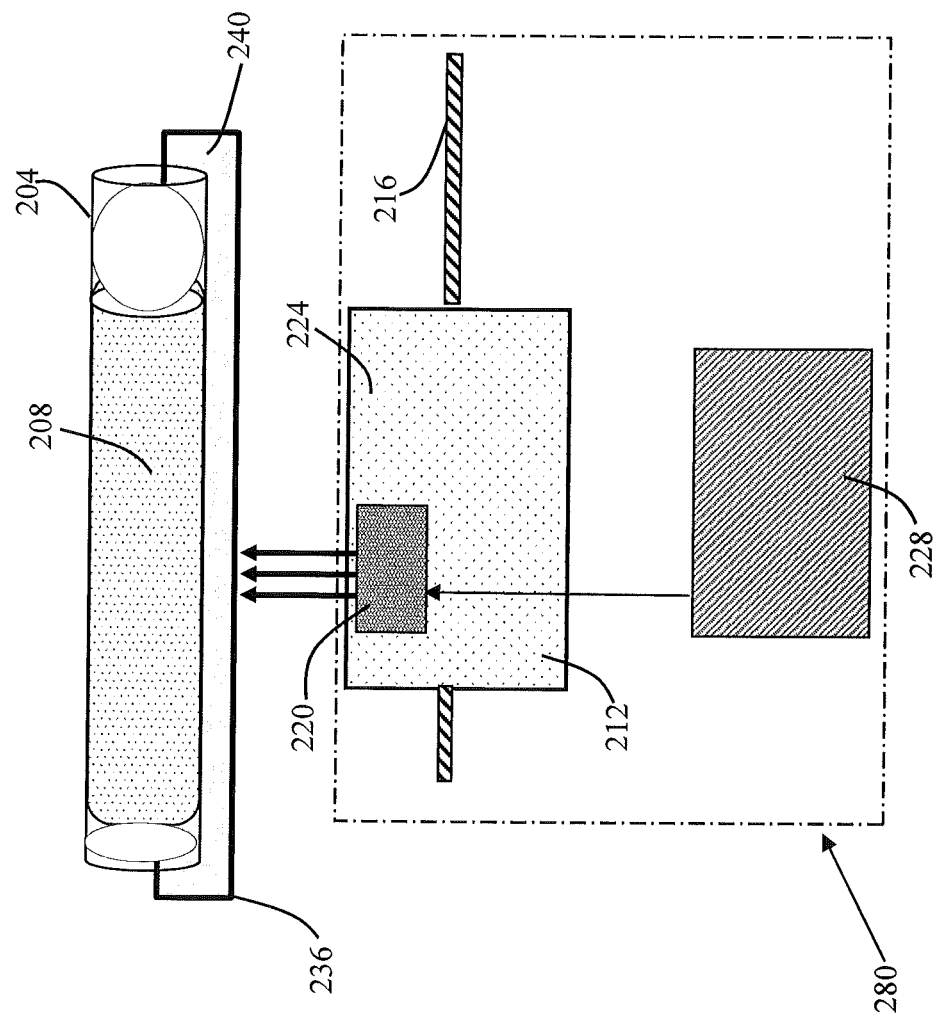
FIG. 2C represents in diagrammatic form an embodiment of the imaging system having the thermal imaging element configured to image through a chamber carrying functional material.

FIG. 2C shows yet another imaging system 280. System 280 contains a chamber 236. Chamber 236 carries functional material 240. Chamber 236 is situated in proximity to rotating cylinder 204 is such a way that during rotation cylinder 204 and imaging substrate 208 immerses in functional material 240 in chamber 236. Thermal imaging head 220 images through chamber 236, causing temperature elevation on specific areas of imaging substrate 208, and thus opto-chemically modify its surface in the imaged areas to enable an efficient diffusion/bonding process of the functional material 240.

All the imaging systems presented show an external drum system, showing imaging substrate 208 attached on the external surface of rotating cylinder 204. A configuration which is not shown herein, may be constructed from a thermal imaging head 220 configured in an internal drum configuration wherein imaging substrate 208 is attached on the internal surface of rotating cylinder 204. In addition imaging head 220 will emit light internally in rotating cylinder 204. The functional material will be also supplied internally inside the drum.

Figure 3:
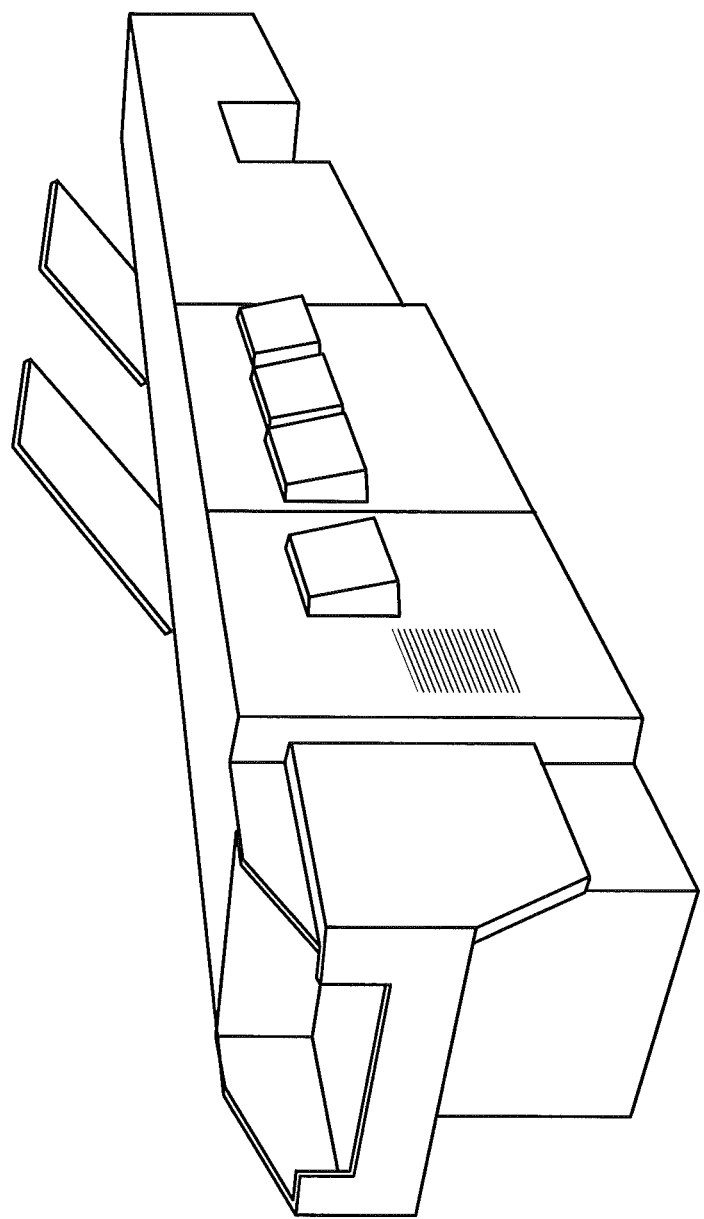
FIG. 3 represents in a diagrammatic form an electro-less coating machinery applied on a patterned substrate according to this invention.

Following the completion of the required patterning on imaging substrate 208, a standard electro-less coating process is performed to build material traces such as copper, silver or nickel traces on imaging substrate 208 by using electro-less coating machinery such as depicted in FIG. 3. These copper traces will form the pattern made by the CTP imaging head 220. See Yinxiang Lu, Qian Liang, Longlong Xue, Applied Surface Science, Volume 258, Issue 10, 1 Mar. 2012, Pages 4782-4787.

Assuming the substrate heat capacity and density are ~1.2 Jg-1K-1 and 1.37 gcm-3 respectively and assuming a penetration depth of 10 μm is required, energy in the vicinity of 1.644 mJ/cm2 will be needed for increasing substrate 208 temperature by 1K. Thus, to achieve 100K temperature an increase of 164 mJ/cm2 will be required, which within the working range of current CTP devices.

Patterning resolution is determined by the resolution of the CTP thermal imaging head 220 and by imaging substrate 208 characteristics such as thermal conductivity.

The invention has been described in detail with particular reference to certain preferred embodiments thereof, but it will be understood that variations and modifications can be effected within the scope of the invention.

PARTS LIST 104 digital front end (DFE)
108 imaging device
112 interface line
200 imaging system
204 rotating cylinder
208 imaging substrate
212 carriage
216 screw
220 thermal imaging head
222 thermal imaging head integrated with a spaying element
224 material spray element
228 controller
232 sprayed material
236 chamber containing functional material
240 functional material
250 imaging system
280 imaging system

The invention claimed is:

1. A method for forming a conductive pattern on a substrate comprising:
   providing an image pattern for imaging on said substrate;
   imaging said image pattern on said substrate creating imaged areas;
   spraying functional material on said substrate that diffuse molecules of said functional material into said imaged areas and wherein said functional material is in a form of liquid; and
   applying electro-less copper coating that build conductive material traces on said imaged areas on said substrate.

2. The method according to claim 1 wherein said functional material is applied during said imaging.

3. The method according to claim 1 wherein said functional material is applied prior to said imaging.

4. The method according to claim 1 wherein said functional material in a form of liquid such as Palladium Chloride (PdCl2) solution.

5. A method for forming a conductive pattern on a substrate comprising:
   providing an image pattern for imaging on said substrate;
   imaging said image pattern on said substrate creating imaged areas;
   spraying functional material on said substrate that diffuse molecules of said functional material into said imaged areas and wherein said functional material is in a form of liquid;
   applying electro-less copper coating that build conductive material traces on said imaged areas on said substrate; and
   wherein said functional material is applied after said imaging.

* * * * *